United States Patent
Xiang et al.

(10) Patent No.: US 10,467,938 B1
(45) Date of Patent: Nov. 5, 2019

(54) SCAN DRIVING CIRCUIT, DISPLAY DEVICE AND DRIVING METHOD

(71) Applicant: Shanghai Tianma AM-OLED Co., Ltd., Shanghai (CN)

(72) Inventors: Dongxu Xiang, Shanghai (CN); Yue Li, Shanghai (CN); Renyuan Zhu, Shanghai (CN); Yana Gao, Shanghai (CN); Xingyao Zhou, Shanghai (CN); Zhonglan Cai, Shanghai (CN); Juan Zhu, Shanghai (CN); Yilin Xu, Shanghai (CN); Gaojun Huang, Shanghai (CN)

(73) Assignee: SHANGHAI TIANMA AM-OLED CO., LTD., Shanghai (CN)

( * ) Notice: Subject to any disclaimer, the term of this patent is extended or adjusted under 35 U.S.C. 154(b) by 0 days.

(21) Appl. No.: 16/161,414

(22) Filed: Oct. 16, 2018

(30) Foreign Application Priority Data

Jun. 25, 2018 (CN) .......................... 2018 1 0663155

(51) Int. Cl.
*G09G 3/20* (2006.01)
*G11C 19/28* (2006.01)

(52) U.S. Cl.
CPC ............. *G09G 3/20* (2013.01); *G11C 19/28* (2013.01); *G09G 2300/0421* (2013.01); *G09G 2310/0286* (2013.01); *G09G 2310/08* (2013.01)

(58) Field of Classification Search
CPC .......... G09G 3/3233; G09G 2300/043; G09G 2300/0426; G09G 2300/0819; G09G 2300/0861; G09G 2310/0251; G09G 2320/0233
See application file for complete search history.

(56) References Cited

U.S. PATENT DOCUMENTS

| | | | |
|---|---|---|---|
| 2011/0142191 A1* | 6/2011 | Tobita | G11C 19/184 377/64 |
| 2016/0372049 A1* | 12/2016 | Wang | G09G 3/3225 |
| 2017/0200417 A1* | 7/2017 | Wu | G09G 3/3291 |

* cited by examiner

*Primary Examiner* — Shaheda A Abdin
(74) *Attorney, Agent, or Firm* — Tarolli, Sundheim, Covell & Tummino LLP

(57) ABSTRACT

The present disclosure provides a driving circuit, a display device and a driving method, aiming to eliminate influence of potential of output terminal of shift register on potential of control node of the shift register and thus avoid an adverse effect on display. The scan driving circuit includes shift registers. Each shift register includes a first node control unit configured to switch on the input terminal and the first node; a second node control unit configured to switch on the second node and the first clock signal terminal and also to switch on the first power voltage terminal and the second node; a first output unit configured to switch on the second power voltage terminal and the output terminal; and a second output unit configured to switch on the second clock signal terminal and the output terminal. The third node is electrically connected to the first node.

20 Claims, 7 Drawing Sheets

SCAN DRIVING CIRCUIT, DISPLAY DEVICE AND DRIVING METHOD

CROSS-REFERENCE TO RELATED APPLICATIONS

The present application claims priority to Chinese Patent Application No. 201810663155.1, filed on Jun. 25, 2018, the content of which is incorporated herein by reference in its entirety.

TECHNICAL FIELD

The present disclosure relates to display technology, and more particularly, to a scan driving circuit, a display device and a driving method.

BACKGROUND

The display panel includes sub-pixels for emitting light and displaying, and the scan driving circuit controls the charging of the sub-pixels by scanning, so as to display an image. The scan driving circuit typically includes a plurality of cascaded shift registers, and each stage of the plurality of cascaded shift registers has a function of shifting an input signal.

In the related art, a control node in the shift register exerts control effect by means of a feedback at an output terminal of the shift register, and the control node is simultaneously used to control a potential at the output terminal of the shift register. Therefore, if the potential at the output terminal of the shift register fails to be switched timely, the potential of the control node will be affected, which further affects the potential at the output terminal of the shift register, thereby resulting in an error in the output of the shift register and an adverse influence on the display.

SUMMARY

The present disclosure provides a scan driving circuit, a display device and a driving method, aiming to avoid an influence of a potential at an output terminal of a shift register on a potential at a control node of the shift register, thereby alleviating an adverse affection on display.

In a first aspect of the present disclosure, a scan driving circuit is provided. The scan driving circuit includes a plurality of cascaded shift registers. Each stage of the plurality of cascaded shift registers includes: a first node control unit electrically connected to a first node, a second node, and an input terminal, wherein the first node control unit is configured to connect the input terminal with the first node in response to a level at the second node; a second node control unit electrically connected to the first node, the second node, a first clock signal terminal and a first power voltage terminal, wherein the second node control unit is configured to connect the second node with the first clock signal terminal in response to a level at the first node, and is further configured to connect the first power voltage terminal with the second node in response to a level at the first clock signal terminal; a first output unit electrically connected to the second node, a second power voltage terminal and an output terminal, wherein the first output unit is configured to connect the second power voltage terminal with the output terminal in response to the level at the second node; and a second output unit electrically connected to a third node, a second clock signal terminal and the output terminal, wherein the second output unit is configured to connect the second clock signal terminal with the output terminal in response to a level at the third node. The third node is electrically connected to the first node.

In a second aspect of the present disclosure, a display device is provided. The display device includes the scan driving circuit as mentioned in the first aspect.

In a third aspect of the present disclosure, a driving method is provided. The driving method is applicable to the scan driving circuit as mentioned in the first aspect. The driving method includes a control method corresponding to each stage of the plurality of cascaded shift registers. The control method includes: in a first period when the first clock signal terminal provides an on level, the second clock signal terminal provides an off level and the input terminal provides an on level, transmitting, by the second node control unit, an on level at the first power voltage terminal to the second node in response to the on level at the first clock signal terminal; transmitting, by the first output unit, an off level at the second power voltage terminal to the output terminal in response to the on level at the second node; transmitting, by the first node control unit, the on level at the input terminal to the first node and the on level at the first node to the third node in response to the on level at the second node; and transmitting, by the second output unit, the off level at the second clock signal terminal to the output terminal in response to the on level at the third node; in a second period when the first clock signal terminal provides an off level, the second clock signal terminal provides an on level and the input terminal provides an off level, transmitting, by the second node control unit, the off level at the first clock signal terminal to the second node in response to the on level at the first node; and transmitting, by the second output unit, the on level at the second clock signal terminal to the output terminal in response to the on level at the third node; and in a third period when the first clock signal terminal provides an on level, the second clock signal terminal provides an off level and the input terminal provides an off level, transmitting, by the second node control unit, the on level at the first power voltage terminal to the second node in response to the on level at the first clock signal terminal; transmitting, by the first output unit, the off level at the second power voltage terminal to the output terminal in response to the on level at the second node; and transmitting, by the first node control unit, the off level at the input terminal to the first node in response to the on level at the second node.

BRIEF DESCRIPTION OF DRAWINGS

In order to more clearly illustrate technical solutions of embodiments of the present disclosure, the accompanying drawings used in the embodiments are briefly described below. The drawings described below are merely a part of the embodiments of the present disclosure. Based on these drawings, those skilled in the art can obtain other drawings without any creative effort.

DESCRIPTION OF EMBODIMENTS

In order to better understand technical solutions of the present disclosure, the embodiments of the present disclosure are described in details with reference to the drawings. It should be clear that the described embodiments are merely part of the embodiments of the present disclosure rather than all of the embodiments. All other embodiments obtained by those skilled in the art without paying creative labor shall fall into the protection scope of the present disclosure.

The terms used in the embodiments of the present disclosure are merely for the purpose of describing specific embodiments, rather than limiting the present disclosure. The singular form "a", "an", "the" and "said" used in the embodiments and claims shall be interpreted as also including the plural form, unless indicated otherwise in the context.

Figure 1:
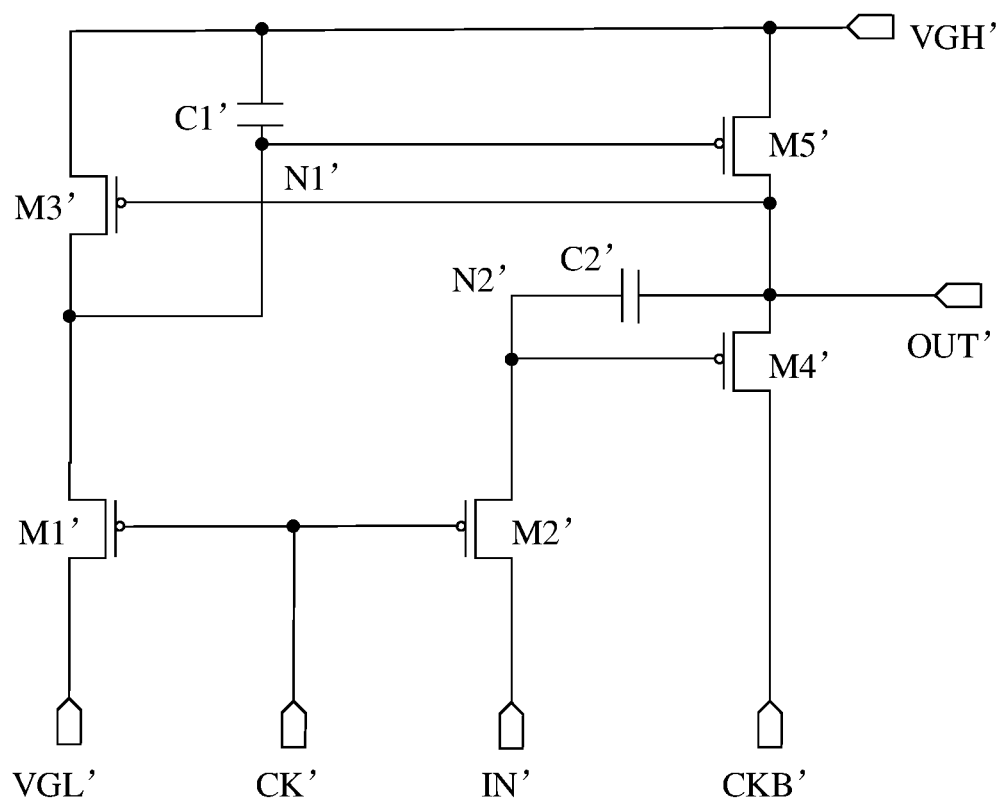
FIG. 1 is a structural schematic diagram of a shift register provided in the prior art.
Figure 2:
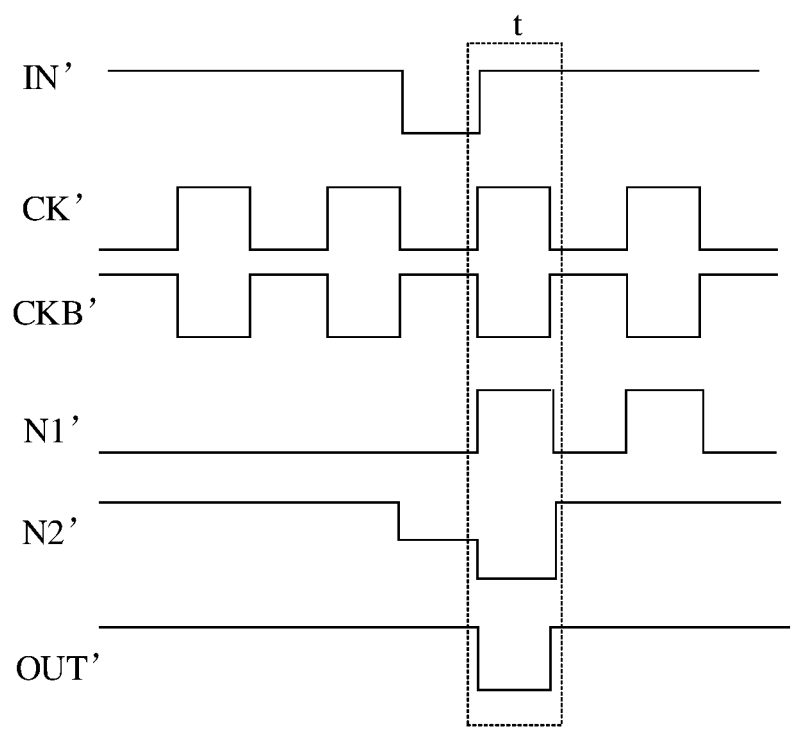
FIG. 2 is a sequence signal diagram of the shift register shown in FIG. 1.

In order to clearly illustrate the effects of the embodiments of the present disclosure, prior to the description of the embodiments of the present invention, a shift register provided in the prior art is taken as an example to specifically describe the technical problem to be solved by the embodiments of the present disclosure. FIG. 1 is a structural schematic diagram of a shift register provided in the prior art, and FIG. 2 is a sequence signal diagram of the shift register shown in FIG. 1. The shift register includes a first transistor M1', a second transistor M2', a third transistor M3', a fourth transistor M4' and a fifth transistor M5'. An output terminal OUT' of the shift register is connected to a control terminal of the third transistor M3'. Therefore, when the shift register operates normally, taking a stage t as an example, in which an input terminal IN' of the shift register provides a high level, a first clock signal terminal CK' provides a high level, a second clock signal terminal CKB' provides a low level, a high level signal terminal VGH' provides a high level, a low level signal terminal VGL' provides a low level and the output terminal OUT' outputs a low level, the third transistor M3' is switched on under the low level through a feedback of the output terminal OUT', and the high level outputted by the high level signal terminal VGH' is written into a first node N1' through the third transistor M3', so that the first node N1' is at a high level, thereby controlling the fifth transistor M5' to be switched off. At this time, a second node NT is at a low level, the fourth transistor M4' is controlled to be switched on, and the low level of the second clock signal terminal CKB' is written into the output terminal OUT', so that the output terminal OUT' of the shift register outputs a low level.

However, based on an internal circuit structure of the shift register, in which the output terminal OUT' of the shift register is connected to the control terminal of the third transistor M3', if a low level is not written into the output terminal OUT' of the shift register in time, the third transistor M3' cannot be switched on in time, and a potential at the first node N1' cannot be written to high in time. In this way, the fifth transistor M5' and the fourth transistor M4' may be simultaneously switched on, which leads to a competition occurring in the output of the output terminal OUT' and may results in an error.

Figure 3:
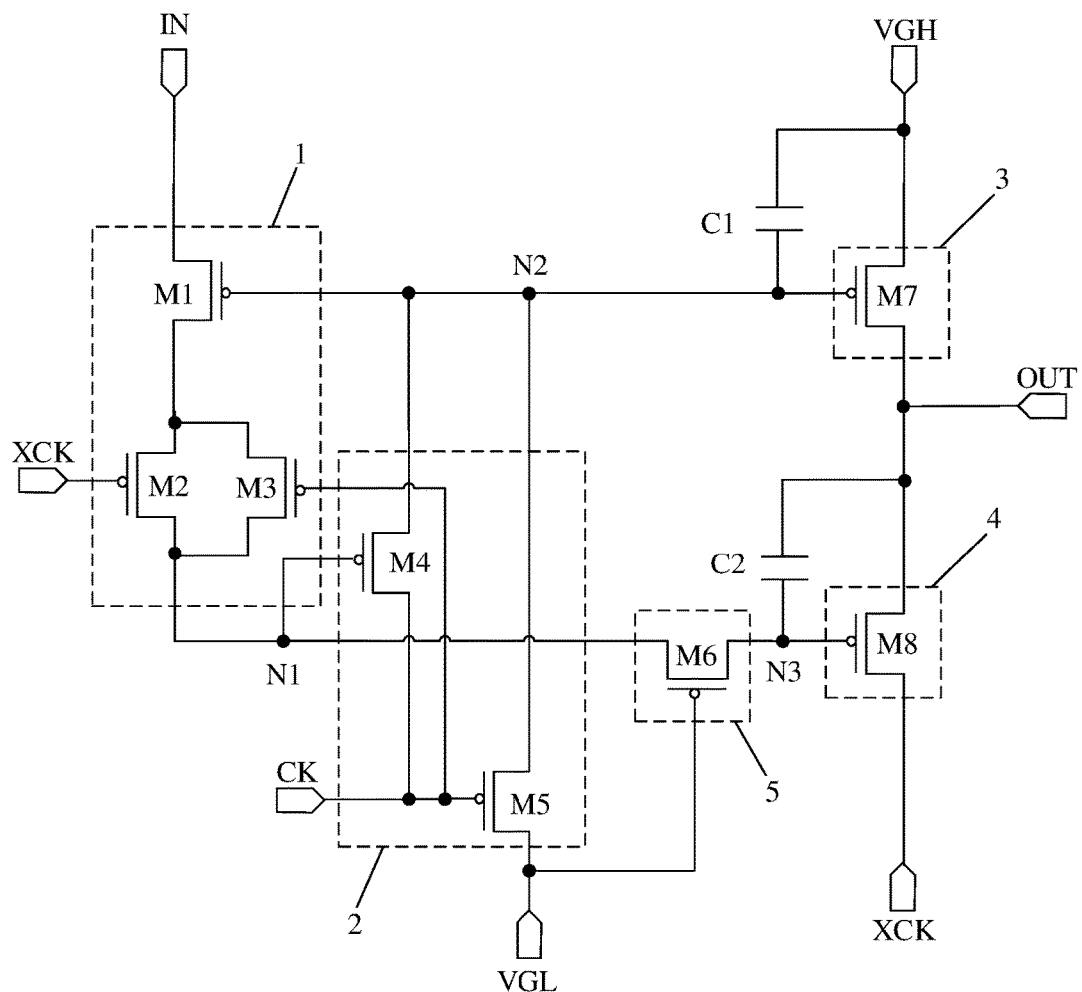
FIG. 3 is a structural schematic diagram of a shift register according to an embodiment of the present disclosure.
Figure 4:
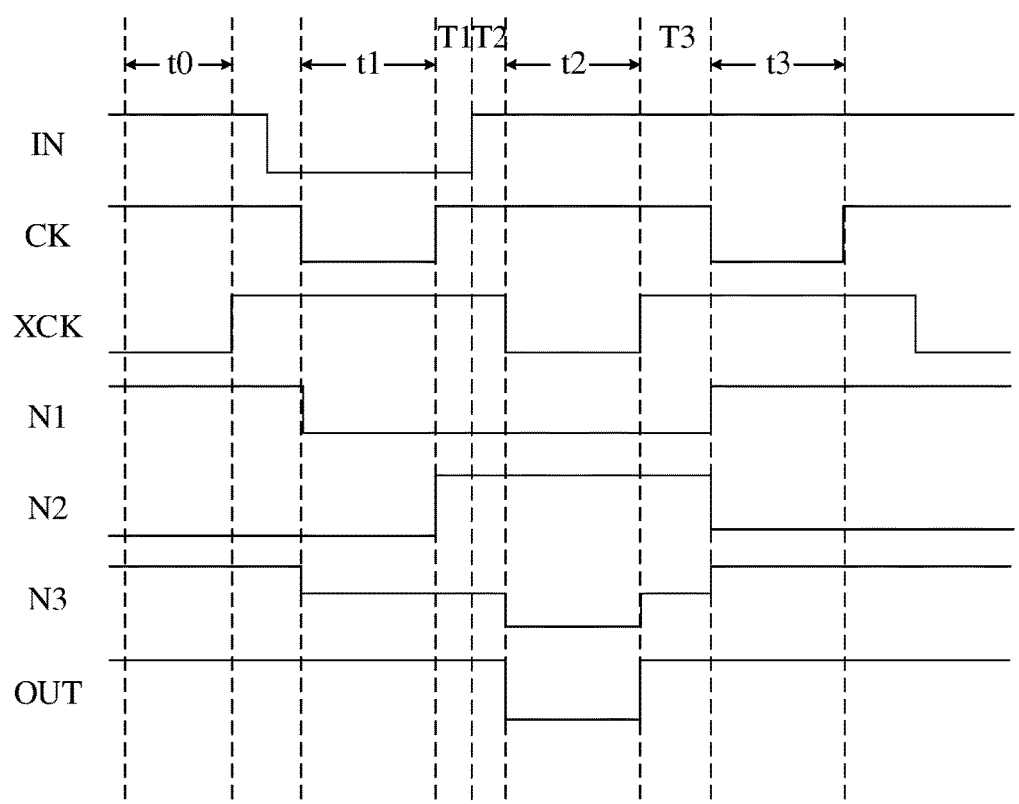
FIG. 4 is a sequence signal diagram of each terminal of the shift register shown in FIG. 3.
Figure 5:
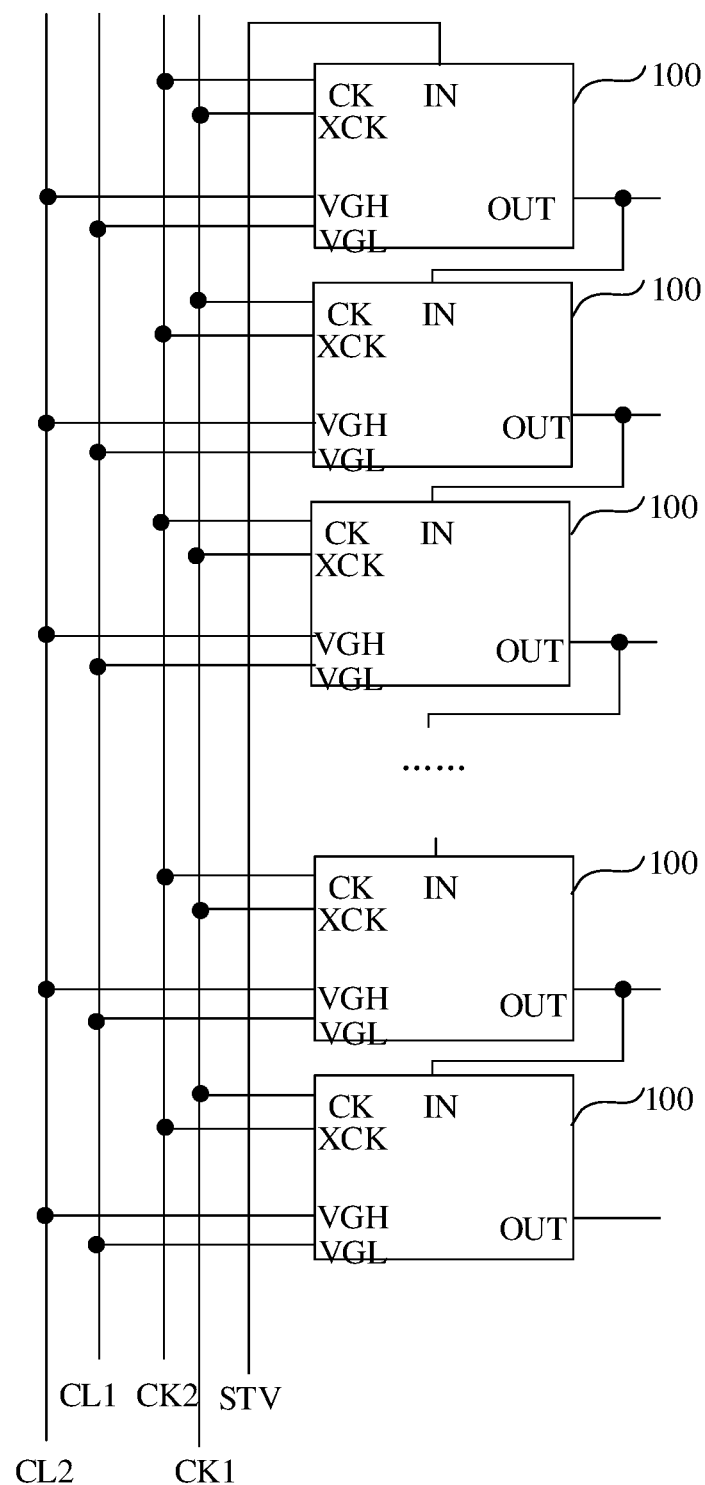
FIG. 5 is a schematic diagram of a driving circuit according to an embodiment of the present disclosure.

FIG. 3 is a structure diagram of a shift register according to an embodiment of the present disclosure, FIG. 4 is a sequence signal diagram of each terminal of the shift register shown in FIG. 3, and FIG. 5 is a schematic diagram of a driving circuit according to an embodiment of the present disclosure. The embodiment of the present invention provides a scan driving circuit, including a plurality of cascaded shift registers 100. Each stage of plurality of cascaded shift registers 100 includes: a first node control unit 1 electrically connected to a first node N1, a second node N2, and an input terminal IN, and configured to connect the input terminal IN with the first node N1 in response to a level at the second node N2; a second signal control unit 2 electrically connected to the first node N1, the second node N2, and a first clock signal terminal CK and a first power voltage terminal VGL, and configured to connect the second node N2 with the first clock signal terminal CK in response to a level at the first node N1 and also configured to connect the first power voltage terminal VGL with the second node N2 in response to a level at the first clock signal terminal CK; a first output unit 3 electrically connected to the second node N2, a second power voltage terminal VGH and an output terminal OUT and configured to connect the second power voltage terminal VGH with the output terminal OUT in response to the level at the second node N2; and a second output unit 4 electrically connected to a third node N3, a second clock signal terminal XCK and the output terminal OUT and configured to connect the second clock signal terminal XCK with the output terminal OUT in response to a level at the third node N3. The third node N3 is electrically connected to the first node.

As shown in FIG. 5, the input terminal IN of a first stage of shift register 100 is connected to a start signal terminal STV; the input terminal IN of each of remaining stages of shift register 100 other than the first stage of shift register 100 is connected to the output terminal OUT of a previous stage of shift register 100 of remaining stages of shift register 100; the first clock signal terminal CK of an odd-numbered stage of shift register 100 is connected to the first clock signal line CK1, and the second clock signal terminal XCK of the odd-numbered stage of shift register is connected to the second clock signal line CK2; the first clock signal terminal CK of an even-numbered stage of shift register is connected to the second clock signal line CK2, and the second clock signal terminal XCK of the even-numbered stage of shift register is connected to the first clock signal line CK1.

In addition, as shown in FIG. 5, in this driving circuit, the first power voltage terminal VGL of each stage of the shift register 100 can be connected to a driving chip (not shown) through the first voltage signal line CL1, and the second power voltage terminal VGH of each stage of the shift register 100 can be connected to the driving chip through the second voltage signal line CL2.

FIG. 4 is a sequence signal diagram of each terminal of the shift register shown in FIG. 3. The embodiment of the present disclosure also provides a driving method for driving the above scan driving circuit. The driving method includes a control method corresponding to each stage of shift register 100. The control method includes:

in a first period t1 when the first clock signal terminal CK provides an on level, the second clock signal terminal XCK provides an off level and the input terminal IN provides an on level, transmitting, by the second node control unit 2, an on level at the first power voltage terminal VGL to the second node N2 in response to the on level at the first clock signal terminal CK, so that a potential of the second node N2 is at an on level; transmitting, by the first output unit 3, an off level at the second power voltage terminal VGH to the output terminal OUT in response to the on level at the second node N2, so that a potential of the output terminal OUT is at an off level; in response to the on level at the second node N2, transmitting, by the first node control unit 1, the on level at the input terminal IN to the first node N1, so that the first node N1 is at an on level, and transmitting, by the first node control unit 1, the on level at the input terminal IN to the third node N3, so that the third node N3 is at an on level; and transmitting, by the second output unit 4, the off level at the second clock signal terminal XCK to the output terminal OUT in response to the on level at the third node N3, so that a potential of the output terminal OUT is at an off level;

in a second period t2 when the first clock signal terminal CK provides an off level, the second clock signal terminal XCK provides an on level, the input terminal IN provides an off level and the first node N1 maintains at an on level, transmitting, by the second node control unit 2, the off level at the first clock signal terminal CK to the second node N2 in response to the on level at the first node N1, so that the potential of the second node N2 is at an off level and the third node N3 is at an on level; and transmitting, by the second output unit 4, the on level at the second clock signal terminal XCK to the output terminal OUT in response to the off level at the third node N3, so that a potential of the output terminal OUT is at an on level; and in a third period t3 when the first clock signal terminal CK provides an on level, the second clock signal terminal XCK provides an off level and the input terminal IN provides an off level, transmitting, by the second node control unit 2, an on level at the first power voltage terminal VGL to the second node N2 in response to the on level at the first clock signal terminal CK, so that the potential of the second node N2 is at an on level; transmitting, by the first output unit 3, an off level at the second power voltage terminal VGH to the output terminal OUT in response to the on level at the second node N2, so that a potential of the output terminal OUT is at an off level; and transmitting, by the first node control unit 1, the off level at the input terminal IN to the first node N1 in response to the on level at the second node N2, so that the potential of the first node N1 is at an off level.

It should be understood that, in the embodiments of the present disclosure, the on level is a low level, and the off level is a high level, which is not specifically limited in the embodiments of the present disclosure. For example, in other embodiments, the on level can be a high level, and the off level can be a low level.

In the shift register and the driving method according to the embodiments of the present disclosure, the potential at each node in the shift register is not directly controlled by the output terminal, and the function of shifting and registering can be achieved normally. Therefore, when the output terminal fails to switch between the high and low levels, the potential at each node in the shift register will not be affected, so that a deviation of the potential at the output terminal can be avoided and the adverse effect on the display can be alleviated.

In an embodiment, the first node control unit 1 is electrically connected to the first clock signal terminal CK and the second clock signal terminal XCK, and the first node control unit 1 is configured to connect the input terminal IN with the first node N1 in response to the levels at second node N2 and at the first clock signal terminal CK, or in response to the levels at the second node N2 and at the second clock signal terminal XCK.

In an embodiment, the first node control unit 1 includes: a first transistor M1, having a first terminal electrically connected to the input terminal IN, a second terminal and a control terminal electrically connected to the second node N2; a second transistor M2, having a first terminal electrically connected to the second terminal of the first transistor M1, a second terminal electrically connected to the first node N1, and a control terminal electrically connected to the second clock signal terminal XCK; and a third transistor M3, having a first terminal electrically connected to the second terminal of the first transistor M1, a second terminal electrically connected to the first node N1, and a control terminal electrically connected to the first clock signal terminal CK.

In the first period t1, the first node N1 is at an on level, the second node N2 is at an on level, the input terminal IN is at an on level; and in the second period t2, the first node N1 maintains at the on level, the second node N2 is at an off level, and the input terminal IN is at an off level. If the first period t1 and the second period t2 are alternated, at a critical time point when directly switching from the first period t1 to the second period t2, the off level at the input terminal IN may be transmitted to the first node N1. In this way, the potential at the first node N1 may be instable, which may result in an abnormal operation of the shift register. The second transistor M2 and the third transistor M3 can control disconnection between the first node N1 and the second terminal of the first transistor M1 between the first period t1 and the second period t2, so as to lower a possibility of a uncertain potential occurring at the first node N1 when switching between the first period t1 and the second period t2, thereby improving the stability of the shift register. In addition, during the first period t1 and the third period t3, when the first transistor M1 is switched on and one of the second transistor M2 and the third transistor M3 is switched on, the second transistor M2 or the third transistor M3 can perform voltage division on the voltage transmitted from the input terminal IN to the first node N1, thereby protecting components in the second node control unit 2 from being damaged by breakdown.

In an embodiment, the second node control unit 2 includes: a fourth transistor M4, having a first terminal electrically connected to the second node N2, a second terminal electrically connected to the first clock signal terminal CK, and a control terminal electrically connected to the first node N1; and a fifth transistor M5, having a first terminal electrically connected to the second node N2, a second terminal electrically connected to the first power voltage terminal VGL, and a control terminal electrically connected to the first clock signal terminal CK.

In an embodiment, each stage of the plurality of shift registers further includes a first capacitor C1. The first capacitor C1 has a first terminal electrically connected to the second power voltage terminal VGH, and a second terminal electrically connected to the second node N2.

In an embodiment, each stage of the plurality of shift registers further includes a second capacitor C2. The second capacitor C2 has a first terminal electrically connected to the output terminal OUT, and a second terminal electrically connected to the third node N3.

In an embodiment, the third node N3 is electrically connected to the first node N1 through a voltage divider 5. The voltage divider 5 is configured to perform voltage division on a voltage transmitted from the first node N1 to the third node N3, thereby protecting components in the second output unit 4 from being damaged by breakdown.

In an embodiment, the voltage divider 5 includes a sixth transistor M6. The sixth transistor M6 has a first terminal electrically connected to the first node N1, a second terminal electrically connected to the third node N3, and a control terminal electrically connected to the first power voltage terminal VGL. Since the first power voltage terminal VGL always outputs an on level, the sixth transistor M6 is always switched on. That is, the sixth transistor M6 only functions as voltage division.

In an embodiment, the first output unit 3 includes a seventh transistor M7. The seventh transistor M7 has a first terminal electrically connected to the second power voltage terminal VGH, a second terminal electrically connected to the output terminal OUT and a control terminal electrically connected to the second node N2.

In an embodiment, the second output unit 4 includes an eighth transistor M8. The eighth transistor M8 has a first terminal electrically connected to the output terminal OUT, a second terminal electrically connected to the second clock signal terminal XCK, and a control terminal electrically connected to the third node N3.

In an embodiment, the driving method further includes: in a first buffering period T1 between the first period t1 and the second period t2, providing an off level by the first clock signal terminal CK and the second clock signal terminal XCK, and providing an on level by the input terminal IN; in a second buffering period T2 between the first buffering period T1 and the second period t2, providing an off level by the first clock signal terminal CK and the second clock signal terminal XCK, and providing an off level by the input terminal IN; and in a third buffering period T3 between the second period t2 and the third period t3, providing an off level by the first clock signal terminal CK, the second clock signal terminal XCK and the input terminal IN.

During the first buffering period T1, the second buffering period T2 and the third buffering period T3, both the second transistor M2 and the third transistor M3 are switched off, so as to reduce mutual influence of respective signal nodes when switching from the first period t1 to the second period t2, and to reduce mutual influence of respective signal nodes when switching from the second period t2 to the third period t3. In this way, the shift register can be more stable.

The above shift register and its driving method will be described by an operating process of a specific shift register. The operating process of the shift register includes:

in a preparing period t0, providing an off level at the first clock signal terminal CK; providing an on level at the second clock signal terminal XCK; providing an off level at the input terminal IN; switching on the second transistor M2, switching off the third transistor M3, switching off the fifth transistor M5; maintaining the first node N1 and the third node N3 at an off level by the second capacitor C2; controlling the eighth transistor M8 to be switched off; maintaining the second node N2 at an off level by the first capacitor C1; controlling the seventh transistor M1 to be switched off; and maintaining the output terminal OUT at an off level by the second capacitor C2, in the first period t1, providing an off level at the first clock signal terminal CK, providing an off level at the second clock signal terminal XCK; providing an on level at the input terminal IN; controlling the fifth transistor M5 to be switched on by the on level at the first clock signal terminal CK; transmitting an on level at the first power voltage terminal VGL to the second node N2, so that a potential of the second node N2 is at an on level to control the seventh transistor M7 to be switched on; transmitting an off level at the second power voltage terminal VGH to the output terminal OUT, so that a potential of the output terminal OUT is at an off level; controlling the first transistor M1 to be switched on by the on level at the second node N2; controlling the third transistor M3 to be switched on by the on level at the first clock signal terminal CK; transmitting the on level at the input terminal IN to the first node N1 through the first transistor M1 and the third transistor M3, so that the first node N1 is at an on level; transmitting the on level at the first node N1 to the third node N3, so that the third node N3 is at an on level to control the eighth transistor M8 to be switched on; and transmitting the off level at the second clock signal terminal XCK to the output terminal OUT, so that a potential of the output terminal OUT is at an off level, in the first buffering period T1, providing an off level at the first clock signal terminal CK and the second clock signal terminal XCK to control the second transistor M2, the third transistor M3 and the fifth transistor M5 to be switched off; providing an on level at the input terminal IN; maintaining the first node N1 and the third node N3 at the on level to control the fourth transistor M4 and the eighth transistor M8 to be switched on; transmitting the off level at the first clock signal terminal CK to the second node N2 through the fourth transistor M4, so that the second node N2 is at an off level to control the seventh transistor M7 to be switched off; and transmitting the off level at the second clock signal terminal XCK to the output terminal OUT through the eighth transistor M8, so that a potential of the output terminal OUT is at an off level, in the second buffering period T2, providing an off level at the first clock signal terminal CK and the second clock signal terminal XCK to control the second transistor M2, the third transistor M3 and the fifth transistor M5 to be switched off; providing an off level at the input terminal IN; maintaining the first node N1 and the third node N3 at an on level to control the fourth transistor M4 and the eighth transistor M8 to be switched on; transmitting the off level at the first clock signal terminal CK to the second node N2 through the fourth transistor M4, so that the second node N2 is at an off level to control the seventh transistor M7 to be switched off; and transmitting the off level at the second clock signal terminal XCK to the output terminal OUT through the eighth transistor M8, so that a potential of the output terminal OUT is at an off level, in the second period t2, providing an off level at the first clock signal terminal CK to control the third transistor M3 and the fifth transistor M5 to be switched off; providing an on level at the second clock signal terminal XCK to control the second transistor M2 to be switched on; providing an off level at the input terminal IN; maintaining the first node N1 at the on level to control the fourth transistor M4 to be switched on; transmitting the off level at the first clock signal terminal CK to the second node N2, so that the potential of the second node N2 is at an off level to control the first transistor M1 and the seventh transistor M7 to be switched off; controlling the sixth transistor M6 to be switched on; transmitting the off level at the second node N2 to the third node N3 through the sixth transistor M6, so that the third node N3 is at an off level; and transmitting the on level at the second clock signal terminal XCK to the output terminal OUT through the eighth transistor M8, so that a potential of the output terminal OUT is at an on level, in the third buffering period T3, providing an off level at the first clock signal terminal CK and the second clock signal terminal XCK to control the second transistor M2, the third transistor M3 and the fifth transistor M5 to be switched off; providing an off level at the input terminal IN; maintaining the first node N1 and the third node N3 at an on level to control the fourth transistor M4 and the eighth transistor M8 to be switched on; transmitting the off level at the first clock signal terminal CK to the second node N2 through the fourth transistor M4, so that the second node N2 is at an off level to control the seventh transistor M7 to be switched off; and transmitting the off level at the second clock signal terminal XCK to the output terminal OUT through the eighth transistor M8, so that a potential of the output terminal OUT is at an off level, and in the third period t3, providing an on level at the first clock signal terminal CK to control the third transistor M3 and the fifth transistor M5 to be switched on; providing an off level at the second clock signal terminal XCK to control the second transistor M2 to be switched off; providing an off level at the input terminal IN; transmitting the on level at the first power voltage terminal VGL to the second node N2 through the fifth transistor M5, so that the second node N2 is at an on level to control the first transistor M1 and the seventh transistor M7 to be switched on; transmitting the off level at the second power voltage terminal VGH to the output terminal OUT through the seventh transistor M7, so that a potential of the output terminal OUT is at an off level; and transmitting the off level at the input terminal IN to the first node N1 through the first transistor M1 and the third transistor M3, so that the potential of the first node N1 is at an off level.

Figure 6:
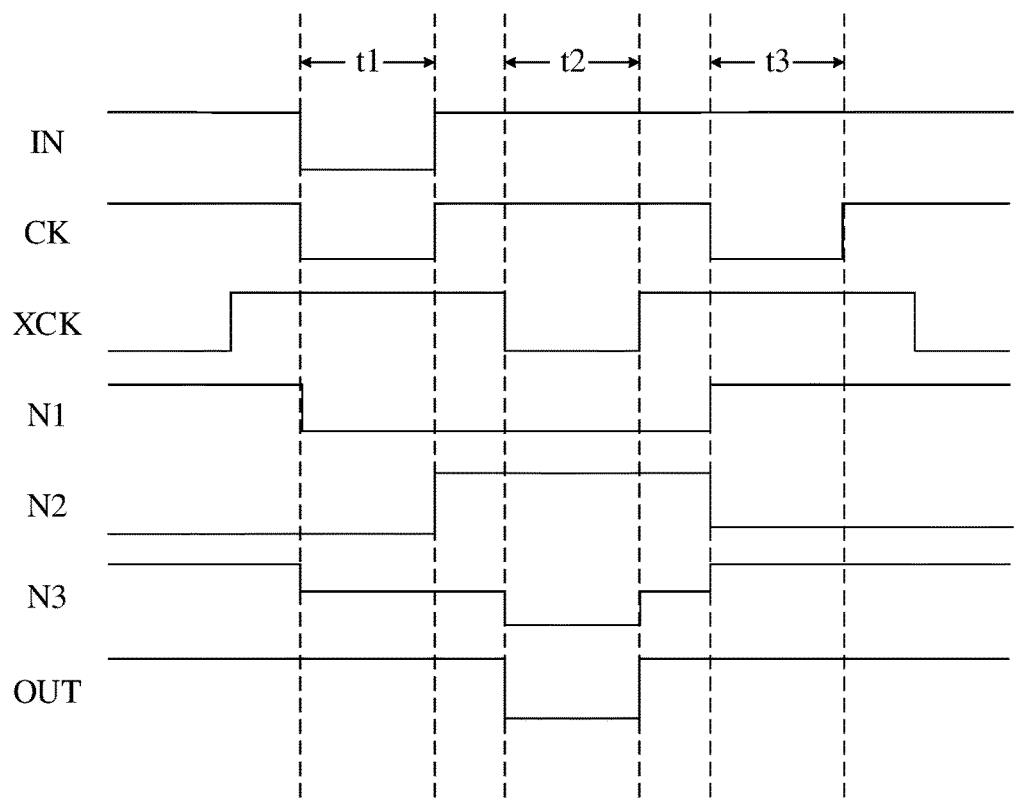
FIG. 6 is a theoretical sequence signal diagram of each terminal of the shift register shown in FIG. 3.

It should be noted that the above shift register is used in a scan driving circuit, and the scan driving circuit includes a plurality of cascaded shift registers. The input terminal of a first stage of shift register is connected to a start signal line, and the start signal is provided by a driving chip. The input terminal of each of remaining stages of shift register other than the first stage of shift register is connected to the output terminal of a previous stage of shift register of remaining stages of shift register. As shown in FIG. 6, which is a theoretical sequence signal diagram of the shift register shown in FIG. 3, with respect to the remaining stages of shift register other than the first stage of shift register, a pulse of the input terminal IN completely coincides with a pulse of the first clock signal terminal CK, theoretically. However, if the pulse of the input terminal IN completely coincides with a pulse of the first clock signal terminal CK, during the first period t1, the off level provided by the input terminal IN is transmitted to the first node N1 through the first transistor M1 and the third transistor M3, when the first clock signal terminal CK provided the on level, thereby resulting in an abnormal operation of the shift register. Therefore, as shown in FIG. 4, in the embodiment of the present disclosure, a first buffering phase T1 is provided to ensure that a rising edge of the signal at the input terminal IN is later than a rising edge of the signal at the first clock signal terminal CK.

In an embodiment, a width-to-length ratio of the eighth transistor M8 is greater than a width-to-length ratio of any one of the first to seventh transistors M1-M7.

The greater the width-to-length ratio is, the stronger the driving capability of the transistor is. Therefore, the driving capability of the shift register can be improved, when the width-to-length ratio of the eighth transistor M8 is greater than the width-to-length ratio of any one of the first to seventh transistors M1-M7. Further, since the output terminal OUT has to be connected to the scan line and thus connected to a row of sub-pixels via the scan line, an obvious delay may occur when the signal outputted by the output terminal OUT of a stage of shift register is transmitted to the input terminal IN of a next stage of shift register, so as to ensure that the rising edge of the signal at the input terminal IN is later than the rising edge of the signal at the first clock signal terminal CK.

In an embodiment, a width-to-length ratio of the third transistor M3 is greater than a width-to-length ratio of the first transistor M1.

The smaller the width-length ratio of the transistor is, the longer the delay of the output signal of the transistor is; the greater the width-length ratio of the transistor is, the faster the transistor switches, i.e., the shorter the delay of the output signal of the transistor is. Therefore, when the width-length ratio of the third transistor M3 is greater than the width-length ratio of the first transistor M1, it is ensured that the third transistor M3 is switched off before the signal of the input terminal IN arrives at the third transistor M3 when the rising edge of the signal at the input terminal IN is the same as the rising edge of the signal at the first clock signal terminal CK, so as to avoid the abnormal operation of the shift register.

In an embodiment, the width-to-length ratio of the third transistor M3 is greater than 1.

In an embodiment, the width-to-length ratio of the first transistor M1 is smaller than 1.

When the width-to-length ratio of the third transistor M3 is greater than 1, and the width-to-length ratio of the first transistor M1 is smaller than 1, they are compatible to most of the panel size requirements.

In an embodiment, in the control method of the first stage of shift register 100, between the first period t1 and the second period t2, a moment when the potential of the input terminal IN (i.e., the start signal terminal STV) jumps from an on level (low level) to an off level (high level) is later than a moment when the potential of the first clock signal terminal CK jumps from an on level (low level) to an off level (high level).

Since the input terminal IN of the first stage of shift register 100 is directly connected to the driving chip, rather than being connected to a row of sub-pixels through a scan line, a potential of the start signal terminal STV can be directly controlled by the driving chip, so as to ensure that the rising edge of the signal at the input terminal IN is later than the rising edge of the signal at the first clock signal terminal CK, thereby improving the stability of the shift register.

It should be understood that the transistors in the embodiments are all illustrated as PMOS transistors. When the control terminal of the PMOS transistor is at a low level, the first terminal and the second terminal are switched on; and when the control terminal of the PMOS transistor is at a high level, the first terminal and the second terminal are switch off. That is, as for a PMOS transistor, the low level is an on level and the high level is an off level. In a specific implementation, the gate of each transistor mentioned above can be used as its control terminal. According to a signal of a gate of each transistor and a type of the signal, the first terminal serves as a source electrode and the second terminal serves as a drain electrode, or the first terminal serves as a drain electrode and the second terminal serves as a source electrode, which is not specifically limited herein. In addition, in the embodiment of the present invention, the "on level" and the "off level" are both generalized, and it is not limited that all of the on or off levels have the same voltage value. The on level refers to any level capable of switching on a transistor, and the off level refers to any level capable of switching off a transistor.

Figure 7:
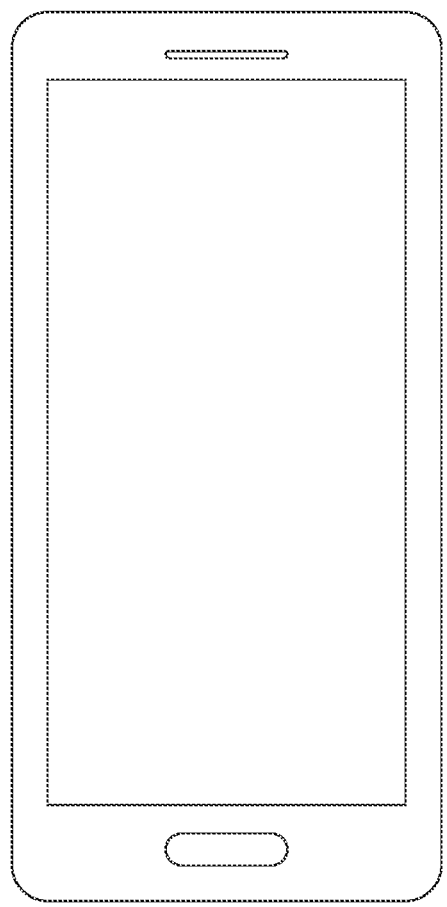
FIG. 7 is a structural schematic diagram of a display device according to an embodiment of the present disclosure.

In addition, the embodiments of the present disclosure further provide a display device as shown in FIG. 7. FIG. 7 is a structural schematic diagram of a display device according to an embodiment of the present disclosure. The display device includes the scan driving circuit as mentioned above.

The driving circuit is described in detail in the above embodiments, and will not be repeated herein. The display device shown in FIG. 7 is merely illustrative. The display device can be any electronic device having a display function, such as a mobile phone, a Tablet PC, an electronic book, a television and the like.

In the display device according to the embodiment of the present disclosure, the potential of each node in the shift register is not directly controlled by the output terminal, and the function of shifting and registering can be achieved normally. Therefore, when the switching of high level-low level of the input terminal is not in time, the potential of each node in the shift register is not affected, which in turn avoids a further deviation of the potential of the input terminal, thereby reducing the adverse effect on the display.

It should be understood that, the above display device provided in the embodiment can be an organic light-emitting device or a liquid crystal display device.

In the organic light-emitting display device, a plurality of organic light-emitting diodes and a pixel compensation circuit connected to each of the plurality of organic light-emitting diodes are generally provided. A light-emitting controlling transistor for controlling the light-emitting of the organic light-emitting diode and a scan controlling transistor for controlling data signal input are provided in the pixel compensation circuit. In a specific implementation, when the display device provided by the embodiment of the present disclosure is an organic light-emitting display device, the organic light-emitting display device may include the above driving circuit provided by the embodiment. The driving circuit can be used as a light-emitting driving circuit to provide a light-emitting control signal to the light-emitting controlling transistor; or the driving circuit can also serve as a gate driving circuit to provide a scan signal to the gate of the scan control transistor. It is also possible that the organic light-emitting display device includes two driving circuits provided by the present embodiment, one of which is used as the light-emitting driving circuit and the other one is used as the gate driving circuit, which is not limited herein.

In the liquid crystal display device, a plurality of pixel electrodes and a switching transistor connected to each of the plurality of pixel electrodes are generally provided. In a specific implementation, when the display device provided by the embodiment is a liquid crystal display device, the driving circuit provided by the present disclosure can serve as a gate driving circuit to provide a scan signal to a gate of the switching transistor.

The above embodiments are merely preferable embodiments of the present disclosure, which are not intended to limit the present disclosure. Any modification, equivalent replacement and improvement within the spirit and principle of the present disclosure shall fall into the scope of the present disclosure.

Finally, it should be noted that, the above-described embodiments are merely for illustrating the present disclosure but not intended to provide any limitation. Although the present disclosure has been described in detail with reference to the above-described embodiments, it should be understood by those skilled in the art that, it is still possible to modify the technical solutions described in the above embodiments or to equivalently replace some or all of the technical features therein, but these modifications or replacements do not cause the essence of corresponding technical solutions to depart from the scope of the present disclosure.

What is claimed is:

1. A scan driving circuit, comprising a plurality of cascaded shift registers, wherein each stage of the plurality of cascaded shift registers comprises:
   a first node control unit electrically connected to a first node, a second node, and an input terminal, wherein the first node control unit is configured to connect the input terminal with the first node in response to a level at the second node;
   a second node control unit electrically connected to the first node, the second node, a first clock signal terminal and a first power voltage terminal, wherein the second node control unit is configured to connect the second node with the first clock signal terminal in response to a level at the first node, and is further configured to connect the first power voltage terminal with the second node in response to a level at the first clock signal terminal;
   a first output unit electrically connected to the second node, a second power voltage terminal and an output terminal, wherein the first output unit is configured to connect the second power voltage terminal with the output terminal in response to the level at the second node; and
   a second output unit electrically connected to a third node, a second clock signal terminal and the output terminal, wherein the second output unit is configured to connect the second clock signal terminal with the output terminal in response to a level at the third node,
   wherein the third node is electrically connected to the first node.

2. The scan driving circuit according to claim 1, wherein the first node control unit is electrically connected to the first clock signal terminal and the second clock signal terminal, and the first node control unit is configured to connect the input terminal with the first node in response to the level at the second node and the level at the first clock signal terminal, or in response to the level at the second node and a level at the second clock signal terminal.

3. The scan driving circuit according to claim 2, wherein the first node control unit comprises:
   a first transistor having a first terminal electrically connected to the input terminal, a second terminal, and a control terminal electrically connected to the second node;
   a second transistor having a first terminal electrically connected to the second terminal of the first transistor, a second terminal electrically connected to the first node, and a control terminal electrically connected to the second clock signal terminal; and
   a third transistor having a first terminal electrically connected to the second terminal of the first transistor, a second terminal electrically connected to the first node, and a control terminal electrically connected to the first clock signal terminal.

4. The scan driving circuit according to claim 3, wherein the second node control unit comprises:
   a fourth transistor having a first terminal electrically connected to the second node, a second terminal electrically connected to the first clock signal terminal, and a control terminal electrically connected to the first node; and
   a fifth transistor having a first terminal electrically connected to the second node, a second terminal electrically connected to the first power voltage terminal, and a control terminal electrically connected to the first clock signal terminal.

5. The scan driving circuit according to claim 4, wherein the third node is electrically connected to the first node through a voltage divider.

6. The scan driving circuit according to claim 5, wherein the voltage divider comprises a sixth transistor having a first terminal electrically connected to the first node, a second terminal electrically connected to the third node, and a control terminal electrically connected to the first power voltage terminal.

7. The scan driving circuit according to claim 6, wherein the first output unit comprises a seventh transistor having a first terminal electrically connected to the second power voltage terminal, a second terminal electrically connected to the output terminal, and a control terminal electrically connected to the second node.

8. The scan driving circuit according to claim 7, wherein the second output unit comprises an eighth transistor having a first terminal electrically connected to the output terminal, a second terminal electrically connected to the second clock signal terminal, and a control terminal electrically connected to the third node.

9. The scan driving circuit according to claim 8, wherein a width-to-length ratio of the eighth transistor is greater than a width-to-length ratio of any one of the first to seventh transistors.

10. The scan driving circuit according to claim 3, wherein a width-to-length ratio of the third transistor is greater than a width-to-length ratio of the first transistor.

11. The scan driving circuit according to claim 10, wherein the width-to-length ratio of the third transistor is greater than 1.

12. The scan driving circuit according to claim 10, wherein a width-to-length ratio of the first transistor is smaller than 1.

13. The scan driving circuit according to claim 1, wherein each stage of the plurality of cascaded shift registers further comprises a first capacitor having a first terminal electrically connected to the second power voltage terminal and a second terminal electrically connected to the second node.

14. The scan driving circuit according to claim 1, wherein each stage of the plurality of cascaded shift registers further comprises a second capacitor having a first terminal electrically connected to the output terminal and a second terminal electrically connected to the third node.

15. A display device, comprising a scan driving circuit, wherein the scan driving circuit comprises a plurality of cascaded shift registers, and each stage of the plurality of cascaded shift registers comprises:
  a first node control unit electrically connected to a first node, a second node, and an input terminal, wherein the first node control unit is configured to connect the input terminal with the first node in response to a level at the second node;
  a second node control unit electrically connected to the first node, the second node, a first clock signal terminal and a first power voltage terminal, wherein the second node control unit is configured to connect the second node with the first clock signal terminal in response to a level at the first node, and is further configured to connect the first power voltage terminal with the second node in response to a level at the first clock signal terminal;
  a first output unit electrically connected to the second node, a second power voltage terminal and an output terminal, wherein the first output unit is configured to connect the second power voltage terminal with the output terminal in response to the level at the second node; and
  a second output unit electrically connected to a third node, a second clock signal terminal and the output terminal, wherein the second output unit is configured to connect the second clock signal terminal with the output terminal in response to a level at the third node,
  wherein the third node is electrically connected to the first node.

16. The display device according to claim 15, wherein the first node control unit is electrically connected to the first clock signal terminal and the second clock signal terminal, and the first node control unit is configured to connect the input terminal with the first node in response to the level at second node and the level at the first clock signal terminal, or in response to the level at the second node and a level at the second clock signal terminal.

17. The display device according to claim 16, wherein the first node control unit comprises:
  a first transistor having a first terminal electrically connected to the input terminal, a second terminal, and a control terminal electrically connected to the second node;
  a second transistor having a first terminal electrically connected to the second terminal of the first transistor, a second terminal electrically connected to the first node, and a control terminal electrically connected to the second clock signal terminal; and
  a third transistor having a first terminal electrically connected to the second terminal of the first transistor, a second terminal electrically connected to the first node, and a control terminal electrically connected to the first clock signal terminal.

18. A driving method, applicable to a scan driving circuit, wherein the scan driving circuit comprises a plurality of cascaded shift registers, and each stage of the plurality of cascaded shift registers comprises:
  a first node control unit electrically connected to a first node, a second node, and an input terminal, wherein the first node control unit is configured to connect the input terminal with the first node in response to a level at the second node;
  a second node control unit electrically connected to the first node, the second node, a first clock signal terminal and a first power voltage terminal, wherein the second node control unit is configured to connect the second node with the first clock signal terminal in response to a level at the first node, and is further configured to connect the first power voltage terminal with the second node in response to a level at the first clock signal terminal;
  a first output unit electrically connected to the second node, a second power voltage terminal and an output terminal, wherein the first output unit is configured to connect the second power voltage terminal with the output terminal in response to the level at the second node; and
  a second output unit electrically connected to a third node, a second clock signal terminal and the output terminal, wherein the second output unit is configured to connect the second clock signal terminal with the output terminal in response to a level at the third node,
  wherein the third node is electrically connected to the first node, wherein the driving method comprises a control method corresponding to each stage of the plurality of cascaded shift registers, and the control method comprises:
in a first period when the first clock signal terminal provides an on level, the second clock signal terminal provides an off level and the input terminal provides an on level, transmitting, by the second node control unit, an on level at the first power voltage terminal to the second node in response to the on level at the first clock signal terminal; transmitting, by the first output unit, an off level at the second power voltage terminal to the output terminal in response to the on level at the second node; transmitting, by the first node control unit, the on level at the input terminal to the first node and the on level at the first node to the third node in response to the on level at the second node; and transmitting, by the second output unit, the off level at the second clock signal terminal to the output terminal in response to the on level at the third node;
in a second period when the first clock signal terminal provides an off level, the second clock signal terminal provides an on level and the input terminal provides an off level, transmitting, by the second node control unit, the off level at the first clock signal terminal to the second node in response to the on level at the first node; and transmitting, by the second output unit, the on level at the second clock signal terminal to the output terminal in response to the on level at the third node; and
in a third period when the first clock signal terminal provides an on level, the second clock signal terminal provides an off level and the input terminal provides an off level, transmitting, by the second node control unit, the on level at the first power voltage terminal to the second node in response to the on level at the first clock signal terminal; transmitting, by the first output unit, the off level at the second power voltage terminal to the output terminal in response to the on level at the second node; and transmitting, by the first node control unit, the off level at the input terminal to the first node in response to the on level at the second node.

19. The driving method according to claim 18, wherein the driving method further comprises:
in a first buffering period between the first period and the second period, providing an off level by the first clock signal terminal and the second clock signal terminal, and providing an on level by the input terminal;
in a second buffering period between the first buffering period and the second period, providing an off level by the first clock signal terminal and the second clock signal terminal, and providing an off level by the input terminal; and
in a third buffering period between the second period and the third period, providing an off level by the first clock signal terminal, the second clock signal terminal and the input terminal.

20. The driving method according to claim 18, wherein in the control method of a first stage of the plurality of cascaded shift registers, between the first period and the second period, a moment when a potential of the input terminal jumps from an on level to an off level is later than a moment when a potential of the first clock signal terminal jumps from an on level to an off level.

* * * * *